(12) United States Patent
Aikawa et al.

(10) Patent No.: US 9,054,179 B2
(45) Date of Patent: Jun. 9, 2015

(54) WAFER PROCESSING METHOD

(71) Applicant: DISCO CORPORATION, Tokyo (JP)

(72) Inventors: Chikara Aikawa, Tokyo (JP);
Kunimitsu Takahashi, Tokyo (JP);
Nobuyasu Kitahara, Tokyo (JP); Seiji Fujiwara, Tokyo (JP); Yoshiaki Yodo, Tokyo (JP); Junichi Kuki, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/514,069

(22) Filed: Oct. 14, 2014

(65) Prior Publication Data

US 2015/0104930 A1    Apr. 16, 2015

(30) Foreign Application Priority Data

Oct. 15, 2013   (JP) .................................. 2013-214761

(51) Int. Cl.
| | |
|---|---|
| H01L 21/00 | (2006.01) |
| H01L 21/78 | (2006.01) |
| H01L 21/683 | (2006.01) |
| H01L 21/268 | (2006.01) |

(52) U.S. Cl.
CPC ............ *H01L 21/78* (2013.01); *H01L 21/6836* (2013.01); *H01L 2221/68327* (2013.01); *H01L 21/268* (2013.01)

(58) Field of Classification Search
None
See application file for complete search history.

(56) References Cited

U.S. PATENT DOCUMENTS

| | | | |
|---|---|---|---|
| 6,420,245 B1* | 7/2002 | Manor | 438/460 |
| 2001/0035401 A1* | 11/2001 | Manor | 219/121.72 |
| 2009/0283127 A1* | 11/2009 | Juso et al. | 136/244 |

FOREIGN PATENT DOCUMENTS

JP     2009-021476     1/2009

* cited by examiner

*Primary Examiner* — Angel Roman
(74) *Attorney, Agent, or Firm* — Greer Burns & Crain Ltd.

(57) ABSTRACT

A wafer processing method divides a wafer into a plurality of individual devices along a plurality of crossing division lines formed on the front side of the wafer. The method includes a functional layer removing step of applying a $CO_2$ laser beam to the wafer along each division line with the spot of the $CO_2$ laser beam, having a width corresponding to the width of each division line set on the upper surface of each division line, thereby removing a functional layer along each division line to form a groove along each division line where the functional layer has been removed, and a groove shaping and debris removing step of applying a laser beam having a wavelength in the ultraviolet region to the wafer along each groove, thereby removing debris sticking to the bottom surface of each groove and also shaping the side walls of each groove.

5 Claims, 12 Drawing Sheets

WAFER PROCESSING METHOD

BACKGROUND OF THE INVENTION

1. Field of the Invention

The present invention relates to a wafer processing method for dividing a wafer into a plurality of individual devices along a plurality of crossing division lines formed on the front side of the wafer, the wafer including a substrate such as a silicon substrate and a functional layer formed on the front side of the substrate, the individual devices being formed from the functional layer and partitioned by the division lines.

2. Description of the Related Art

As well known in the art, in a semiconductor device fabrication process, a functional layer composed of an insulating film and a functional film is formed on the front side of a substrate such as a silicon substrate, and a plurality of devices such as ICs and LSIs are formed like a matrix from this functional layer, thus obtaining a semiconductor wafer having the plural devices. The plural devices are partitioned by a plurality of division lines formed on the front side of the semiconductor wafer. The semiconductor wafer is divided along these division lines to obtain the individual devices as chips.

In recent years, a semiconductor wafer intended to improve the processing performance of semiconductor chips (devices) such as ICs and LSIs has been put into practical use. This semiconductor wafer is composed of a substrate such as a silicon substrate and a functional layer formed on the front side of the substrate, wherein the functional layer is composed of a low-permittivity insulator film (low-k film) and a functional film formed on the low-k film, the functional film forming a plurality of circuits. Thus, the semiconductor devices are formed from the functional layer. The low-k film is formed from an inorganic film of SiOF, BSG (SiOB), etc. or an organic film such as a polymer film of polyimide, parylene, etc.

Division of such a semiconductor wafer along the division lines is usually performed by using a cutting apparatus called a dicing saw. This cutting apparatus includes a chuck table for holding the semiconductor wafer as a workpiece, cutting means for cutting the semiconductor wafer held on the chuck table, and moving means for relatively moving the chuck table and the cutting means. The cutting means includes a rotating spindle adapted to be rotated at high speeds and a cutting blade mounted on the rotating spindle. The cutting blade is composed of a disk-shaped base and an annular cutting edge mounted on one side surface of the base along the outer circumference thereof. The annular cutting edge is an electroformed diamond blade formed by bonding diamond abrasive grains having a grain size of about 3 μm, for example.

However, it is difficult to cut the low-k film mentioned above by using the cutting blade. That is, the low-k film is very brittle like mica. Accordingly, when the semiconductor wafer having the low-k film is cut along the division lines by using the cutting blade, there arises a problem such that the low-k film may be separated and this separation may reach the devices to cause fatal damage to the devices.

To solve this problem, Japanese Patent Laid-open No. 2009-21476 discloses a wafer dividing method including the steps of applying a laser beam along both sides of each division line on a semiconductor wafer to form two laser processed grooves along each division line, thereby dividing a stacked layer and next positioning a cutting blade between the outer side walls of the two laser processed grooves along each division line to relatively move the cutting blade and the semiconductor wafer, thereby cutting the semiconductor wafer along each division line.

SUMMARY OF THE INVENTION

However, when the wafer is cut by the cutting blade in the condition where the cutting blade is positioned at the lateral center between the two laser processed grooves, there arises a new problem such that the cutting blade may meander so as to be caught by the two laser processed grooves as in the case that a tire is caught by a rut on a road, causing the separation of the functional layer and a reduction in device quality.

Further, the present inventors tried to entirely remove the functional layer along each division line and found that a laser beam must be applied plural times along each division line, causing a reduction in productivity. In addition, the upper surface of the semiconductor substrate exposed to each division line is ablated to be roughened by the laser beam, causing a reduction in linearity of travel of the cutting blade along each division line.

It is therefore an object of the present invention to provide a wafer processing method which can efficiently remove the functional layer formed on the front side (upper surface) of the substrate along each division line and can also smoothen the upper surface of the substrate exposed to each division line where the functional layer has been removed.

In accordance with an aspect of the present invention, there is provided a wafer processing method for dividing a wafer into a plurality of individual devices along a plurality of crossing division lines formed on the front side of the wafer, the wafer including a substrate and a functional layer formed on the front side of the substrate, the individual devices being formed from the functional layer and partitioned by the division lines. The wafer processing method includes a functional layer removing step of applying a $CO_2$ laser beam to the wafer along each division line in the condition where the spot of the $CO_2$ laser beam having a width corresponding to the width of each division line is set on the upper surface of each division line, thereby removing the functional layer along each division line to form a groove along each division line where the functional layer has been removed; a groove shaping and debris removing step of applying a laser beam having a wavelength in the ultraviolet region to the wafer along each groove after performing the functional layer removing step, thereby removing debris sticking to the bottom surface of each groove and also shaping the side walls of each groove; and a dividing step of cutting the wafer along each groove after performing the groove shaping and debris removing step, thereby dividing the wafer into the individual devices.

Preferably, the wafer processing method further includes a wafer supporting step of attaching a dicing tape to the back side of the substrate constituting the wafer and supporting the peripheral portion of the dicing tape to an annular frame before performing the functional layer removing step. Preferably, the wafer processing method further includes a protective film forming step of forming a protective film on the front side of the functional layer constituting the wafer before performing the functional layer removing step.

Preferably, the wavelength of the $CO_2$ laser beam to be used in the functional layer removing step is set to 9.4 μm or 10.6 μm, and the wavelength of the laser beam to be used in the groove shaping and debris removing step is set to 266 nm or 355 nm.

Preferably, the dividing step is performed by using a cutting blade having a peripheral cutting edge.

In the functional layer removing step of the wafer processing method according to the present invention, the $CO_2$ laser beam is applied to the wafer along each division line in the condition where the spot of the $CO_2$ laser beam having a width corresponding to the width of each division line is set on the upper surface of each division line, thereby removing the functional layer along each division line. The functional layer can be removed along each division line by one stroke of application of the $CO_2$ laser beam having a high power, thereby improving the productivity.

In the groove shaping and debris removing step of the wafer processing method according to the present invention, the debris sticking to the upper surface of the substrate exposed to each groove where the functional layer has been removed can be removed to thereby smoothen the upper surface of the substrate. Accordingly, in cutting the wafer along each division line, i.e., along each groove in the dividing step, a cutting blade can be relatively moved along each groove with a higher level of linearity, so that the wafer can be cut accurately along each division line where the groove is formed.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1A:
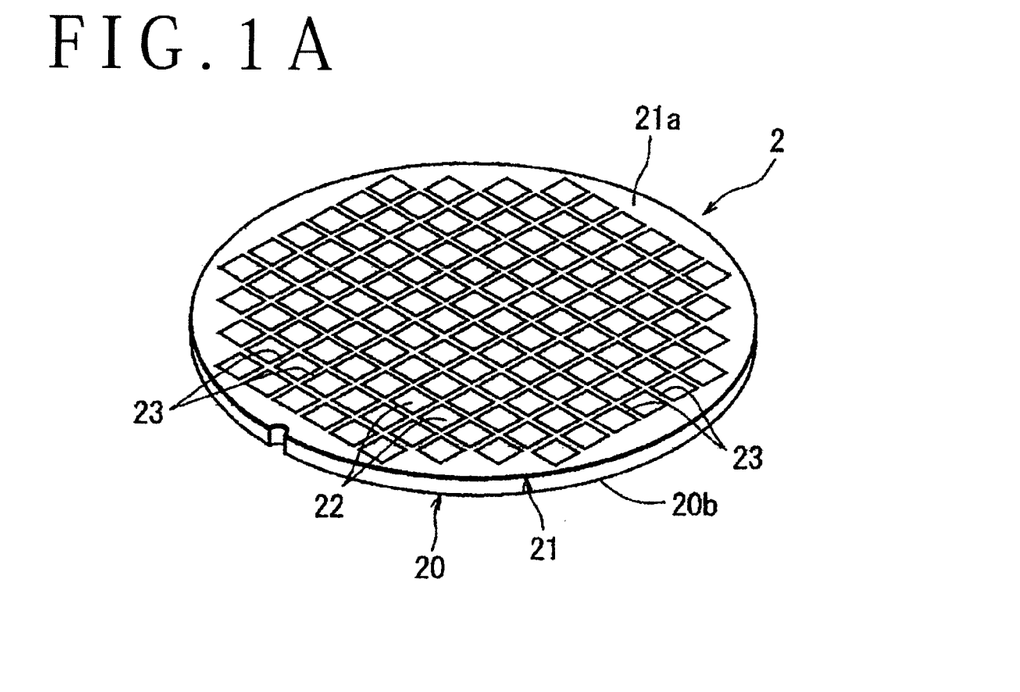
FIG. 1A is a perspective view showing a semiconductor wafer.
Figure 1B:
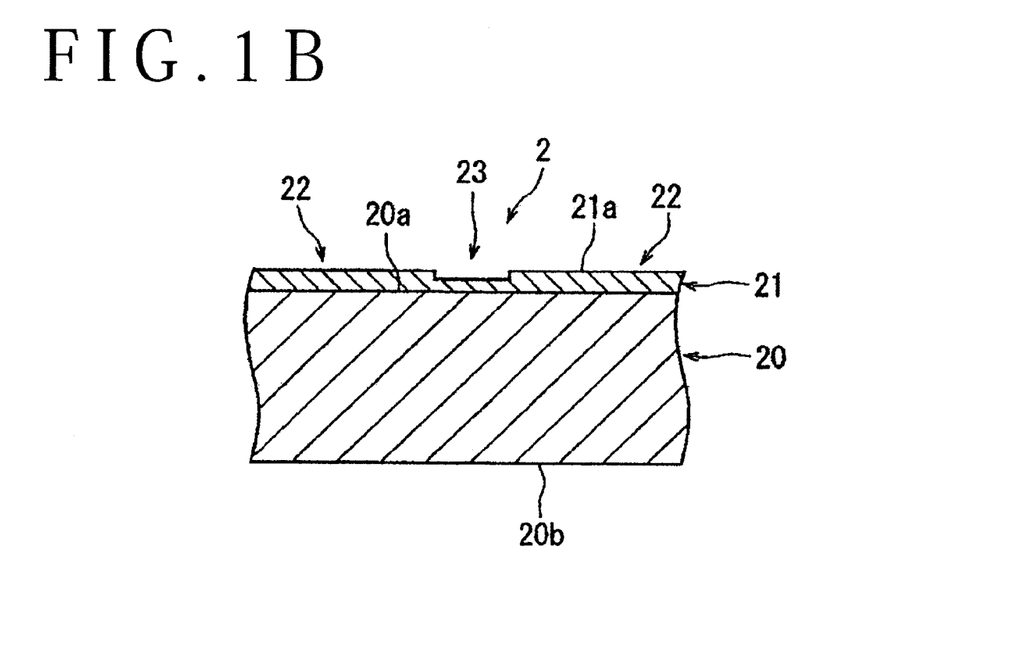
FIG. 1B is an enlarged sectional view of an essential part of the semiconductor wafer shown in FIG. 1A.

The wafer processing method according to the present invention will now be described in more detail with reference to the attached drawings. FIG. 1A is a perspective view of a semiconductor wafer 2 to be divided into individual devices by the wafer processing method according to the present invention, and FIG. 1B is an enlarged sectional view of an essential part of the semiconductor wafer 2 shown in FIG. 1A. As shown in FIGS. 1A and 1B, the semiconductor wafer 2 is composed of a substrate 20 such as a silicon substrate and a functional layer 21 formed on the front side 20a of the substrate 20. For example, the substrate 20 has a thickness of 150 μm. The functional layer 21 is composed of an insulating film and a functional film formed on the insulating film, the functional film forming a plurality of circuits. A plurality of devices 22 such as ICs and LSIs are formed like a matrix from the functional layer 21. These devices 22 are partitioned by a plurality of crossing division lines 23 (each having a width of 100 μm in this preferred embodiment) formed on the functional layer 21. In this preferred embodiment, the insulating film constituting the functional layer 21 is provided by an $SiO_2$ film or a low-permittivity insulator film (low-k film). Examples of the low-k film include an inorganic film of SiOF, BSG (SiOB), etc. and an organic film such as a polymer film of polyimide, parylene, etc. For example, the thickness of the insulating film is set to 10 μm.

Figure 2:
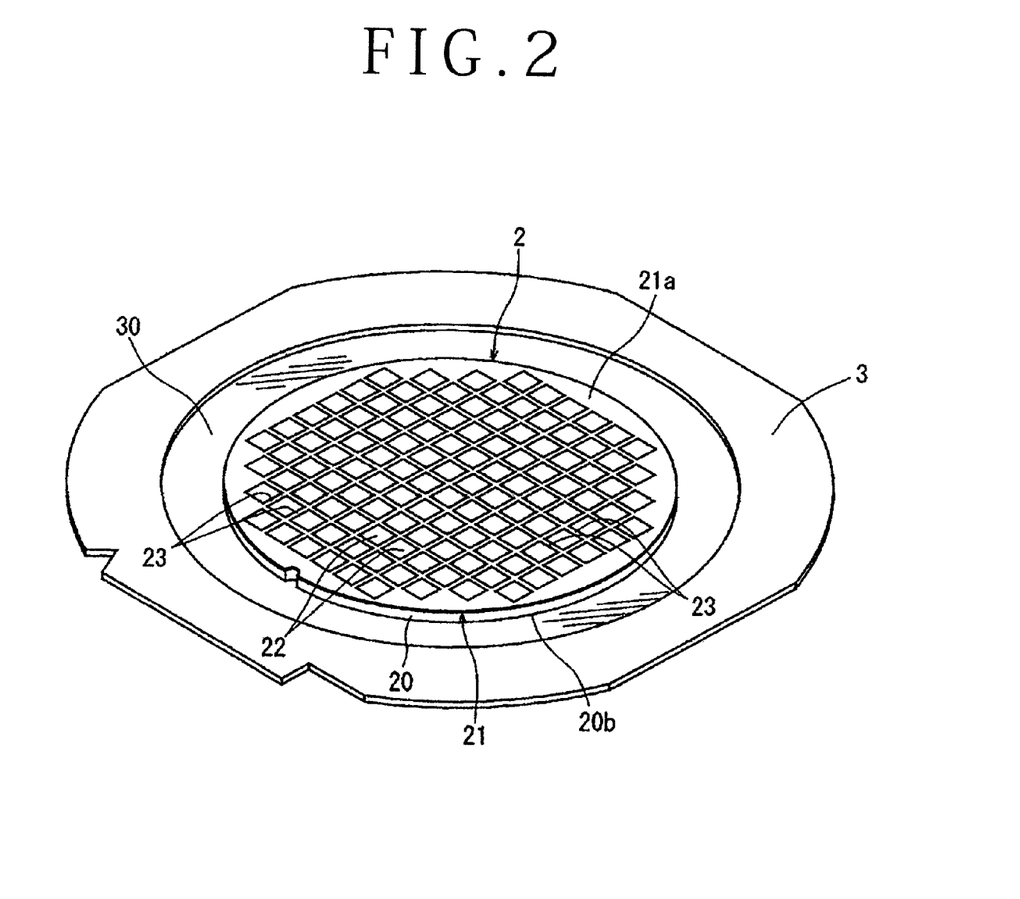
FIG. 2 is a perspective view showing a condition where the back side of the semiconductor wafer is attached to a dicing tape supported to an annular frame.

The wafer processing method for dividing the semiconductor wafer 2 along the division lines 23 will now be described. First, a wafer supporting step is performed in such a manner that a dicing tape is attached to the back side 20b of the substrate 20 constituting the semiconductor wafer 2 and the peripheral portion of the dicing tape is supported to an annular frame. More specifically, as shown in FIG. 2, a dicing tape 30 is supported at its peripheral portion to an annular frame 3 so as to close the inside opening of the annular frame 3. The back side 20b of the substrate 20 constituting the semiconductor wafer 2 is attached to the front side (upper surface) of the dicing tape 30 supported to the annular frame 3. Accordingly, the semiconductor wafer 2 is supported through the dicing tape 30 to the annular frame 3 in the condition where the front side 21a of the functional layer 21 is oriented upward.

Figure 3A:
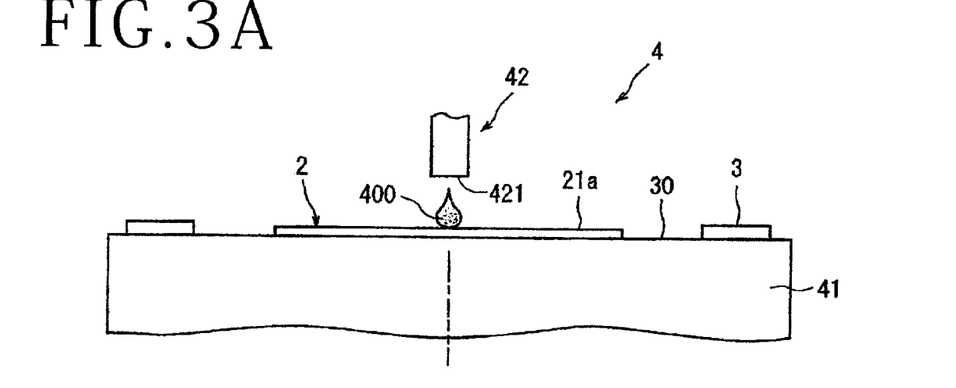
FIGS. 3A to 3C are views for illustrating a protective film forming step.

After performing the wafer supporting step mentioned above, a protective film forming step is performed in such a manner that a protective film is formed on the front side 21a of the functional layer 21 constituting the semiconductor wafer 2. The protective film forming step will now be described with reference to FIGS. 3A to 3C. In the protective film forming step shown in FIGS. 3A and 3B, the dicing tape 30 attached to the semiconductor wafer 2 by performing the wafer supporting step is first placed on a spinner table 41 included in a protective film forming apparatus 4. Thereafter, suction means (not shown) is operated to hold the semiconductor wafer 2 through the dicing tape 30 on the spinner table 41 under suction. Accordingly, the semiconductor wafer 2 is held on the spinner table 41 in the condition where the front side 21a of the functional layer 21 of the semiconductor wafer 2 is oriented upward as shown in FIG. 3A. After holding the semiconductor wafer 2 on the spinner table 41 under suction as mentioned above, a nozzle opening 421 included in a liquid resin nozzle 42 is positioned directly above the center of the semiconductor wafer 2 held on the spinner table 41 as shown in FIG. 3A. Thereafter, liquid resin supplying means (not shown) is operated to drop a predetermined amount of liquid resin 400 from the nozzle opening 421 of the liquid resin nozzle 42. The liquid resin 400 is preferably selected from a water-soluble resin such as PVA (polyvinyl alcohol), PEG (polyethylene glycol), and PEO (polyethylene oxide). In the case that the diameter of the semiconductor wafer 2 is 200 mm, the amount of the liquid resin 400 to be dropped is set to about 10 to 20 ml (milliliters), for example.

Figure 3B:
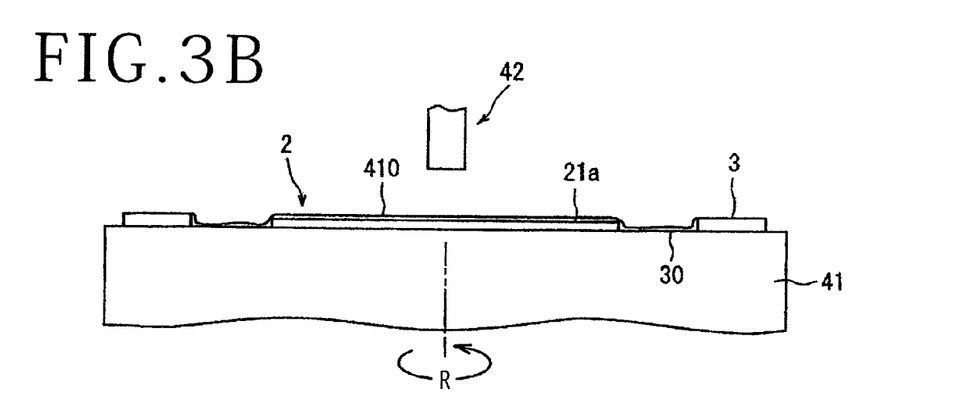
Figure 3C:
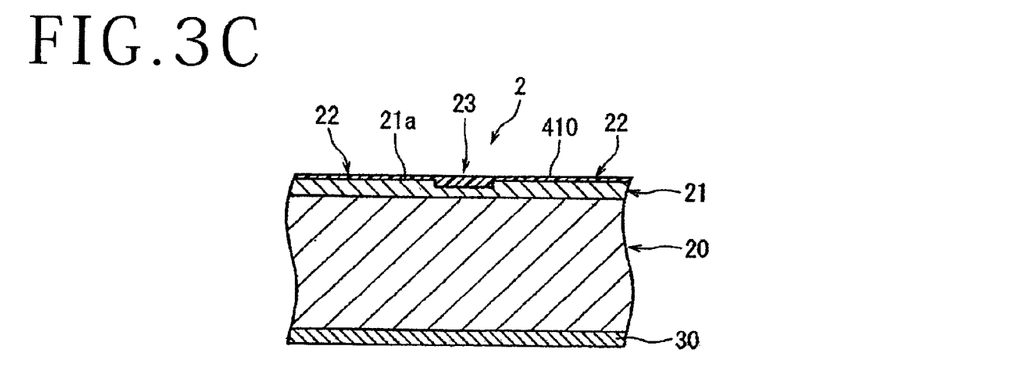

After dropping the predetermined amount of the liquid resin 400 onto the central area of the front side 21a of the functional layer 21 of the semiconductor wafer 2 as mentioned above, the spinner table 41 is rotated in the direction shown by an arrow R in FIG. 3B at 100 rpm for about five seconds, for example. As a result, the liquid resin 400 dropped onto the central area of the front side 21a of the functional layer 21 of the semiconductor wafer 2 is caused to flow toward the outer circumference of the semiconductor wafer 2 by the action of a centrifugal force, so that the liquid resin 400 is spread over the entire surface of the front side 21a of the functional layer 21. Accordingly, a protective film 410 having a thickness of 0.2 to 10 µm is formed on the front side 21a of the functional layer 21 as shown in FIGS. 3B and 3C (protective film forming step). The thickness of the protective film 410 can be adjusted according to the amount of the liquid resin 400 to be dropped, the rotational speed of the spinner table 41, and the duration of rotation of the spinner table 41.

Figure 4:
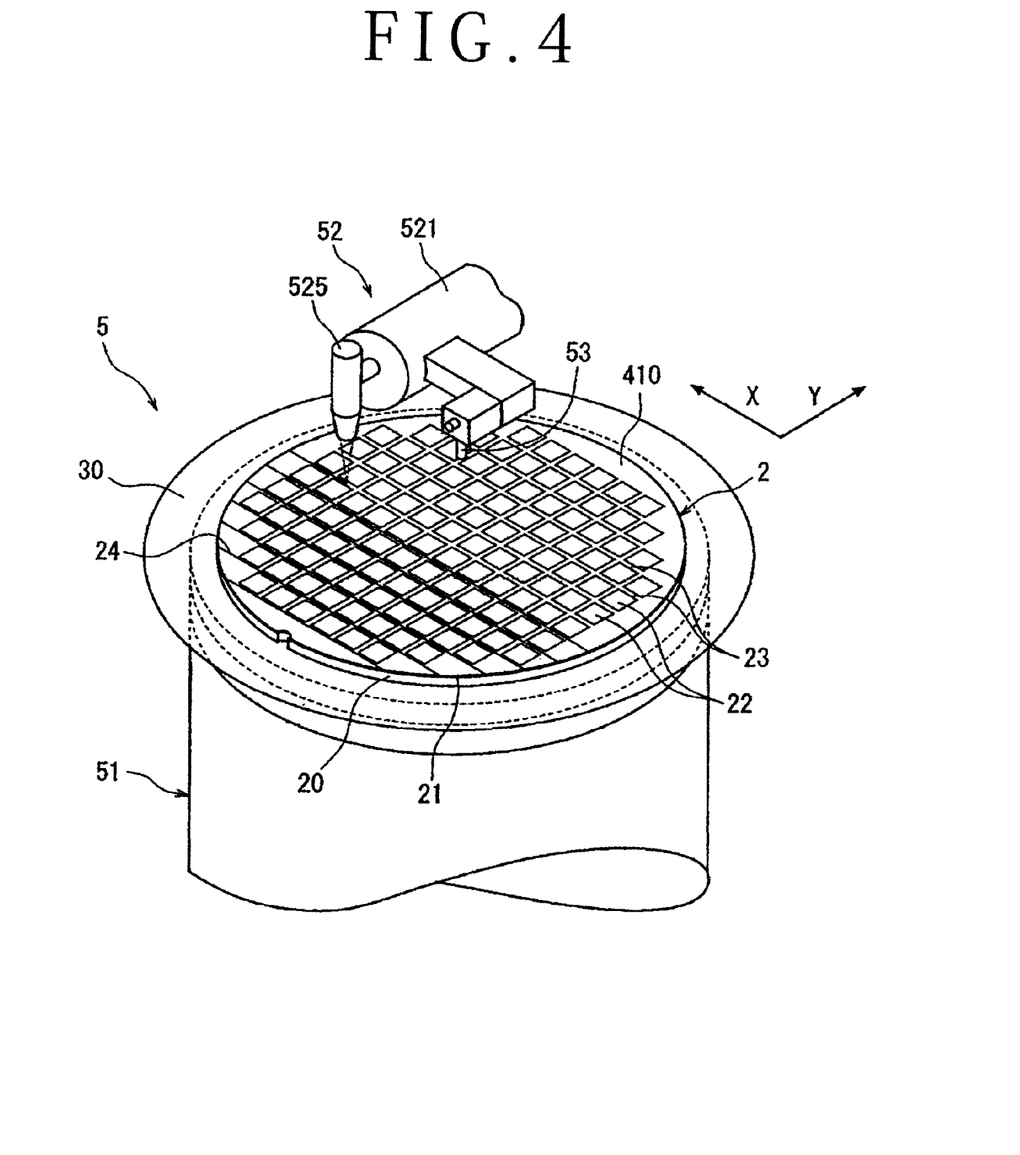
FIG. 4 is a perspective view of an essential part of a laser processing apparatus for performing a functional layer removing step.

After performing the protective film forming step mentioned above, a functional layer removing step is performed in such a manner that a $CO_2$ laser beam is applied to the semiconductor wafer 2 along each division line 23 in the condition where the spot of the $CO_2$ laser beam having a width corresponding to the width of each division line 23 is set on the upper surface of each division line 23, thereby removing the functional layer 21 along each division line 23. This functional layer removing step is performed by using a laser processing apparatus 5 shown in FIG. 4. As shown in FIG. 4, the laser processing apparatus 5 includes a chuck table 51 for holding a workpiece, laser beam applying means 52 for applying a laser beam to the workpiece held on the chuck table 51, and imaging means 53 for imaging the workpiece held on the chuck table 51. The chuck table 51 has an upper surface as a holding surface for holding the workpiece thereon under suction. The chuck table 51 is movable both in the feeding direction shown by an arrow X in FIG. 4 by feeding means (not shown) and in the indexing direction shown by an arrow Y in FIG. 4 by indexing means (not shown).

Figure 5:
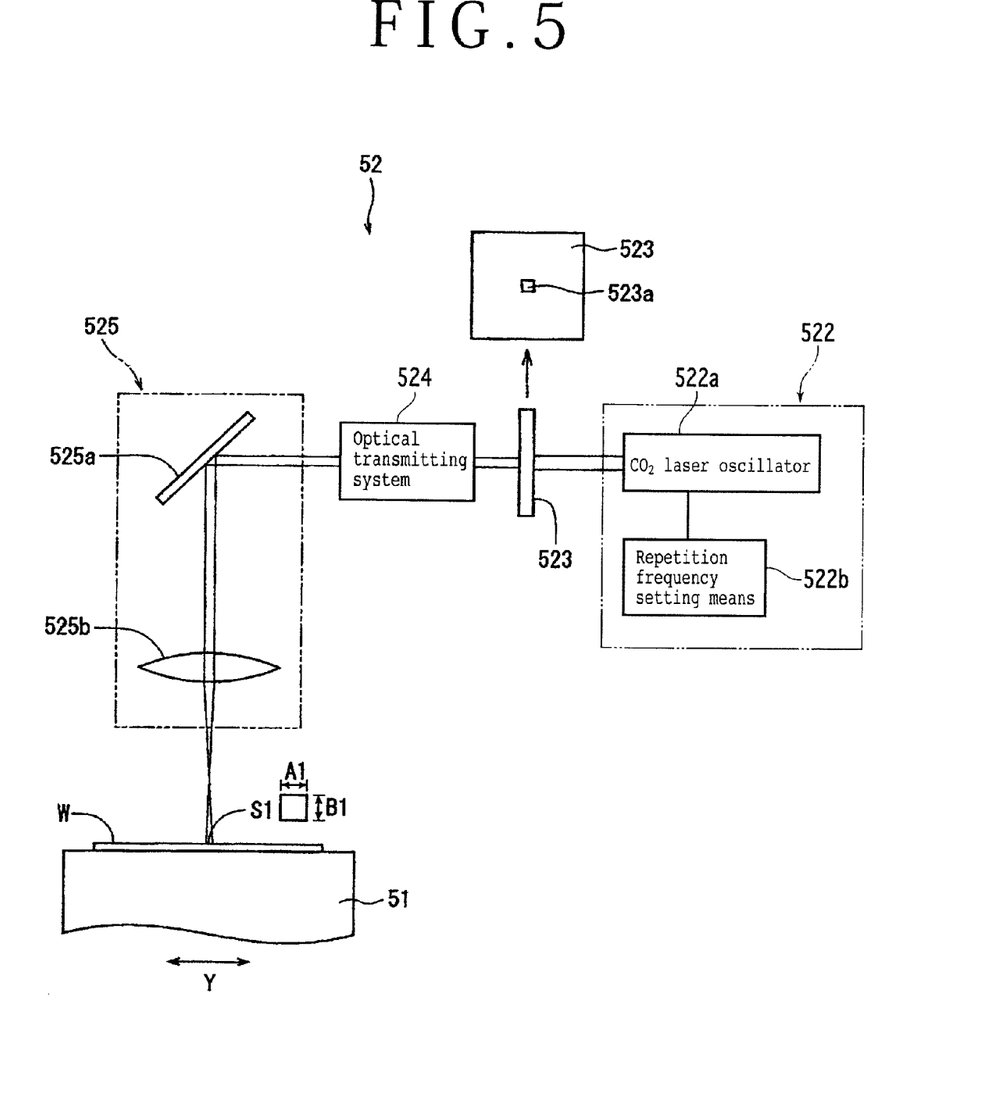
FIG. 5 is a schematic diagram showing the configuration of laser beam applying means included in the laser processing apparatus shown in FIG. 4.

The laser beam applying means 52 includes a cylindrical casing 521 extending in a substantially horizontal direction. As shown in FIG. 5, the casing 521 contains $CO_2$ laser beam oscillating means 522 for oscillating a $CO_2$ laser beam, a mask member 523 for changing the sectional shape of the $CO_2$ laser beam to a square shape, and an optical transmitting system 524 for transmitting the $CO_2$ laser beam whose sectional shape has been changed to a square shape by the mask member 523. The $CO_2$ laser beam oscillating means 522 is composed of a $CO_2$ laser oscillator 522a and repetition frequency setting means 522b connected thereto. In this preferred embodiment, the $CO_2$ laser oscillator 522a oscillates a $CO_2$ laser beam having a wavelength of 9.4 µm or 10.6 µm. Further, the mask member 523 has a square opening 523a having a size of 3 mm×3 mm, for example. The optical transmitting system 524 functions to guide the $CO_2$ laser beam passed through the mask member 523 to focusing means 525 mounted on the front end of the casing 521.

As shown in FIG. 5, the focusing means 525 includes a direction changing mirror 525a and an image forming lens 525b. The direction changing mirror 525a functions to perpendicularly change the traveling direction of the $CO_2$ laser beam oscillated by the $CO_2$ laser beam oscillating means 522, next changed in sectional shape by the mask member 523, and next guided by the optical transmitting system 524 so that the $CO_2$ laser beam is directed toward the image forming lens 525b. The image forming lens 525b functions to image the $CO_2$ laser beam whose traveling direction has been changed by the direction changing mirror 525a, on the upper surface of a workpiece W held on the chuck table 51. That is, the $CO_2$ laser beam is imaged as a square spot S1 on the upper surface of the workpiece W by the image forming lens 525b as shown in FIG. 5. In this preferred embodiment, the square spot S1 has a size (A1×B1) of 100 µm×100 µm. The dimension (width) A1 of the square spot S1 of the $CO_2$ laser beam in the Y direction is set to a value corresponding to the width of each division line 23 (i.e., 100 µm in this preferred embodiment).

The imaging means 53 is mounted on a front end portion of the casing 521 constituting the laser beam applying means 52 as shown in FIG. 4. The imaging means 53 includes illuminating means for illuminating the workpiece, an optical system for capturing an area illuminated by the illuminating means, and an imaging device (CCD) for imaging the area captured by the optical system. An image signal output from the imaging means 53 is transmitted to control means (not shown).

There will now be described with reference to FIG. 4 and FIGS. 6A to 6D the functional layer removing step of applying a $CO_2$ laser beam to the semiconductor wafer 2 along each division line 23 in the condition where the spot of the $CO_2$ laser beam having a width corresponding to the width of each division line 23 is set on the upper surface of each division line 23, by using the laser processing apparatus 5 mentioned above, thereby removing the functional layer 21 along each division line 23.

First, the semiconductor wafer 2 processed by the protective film forming step is placed on the chuck table 51 of the laser processing apparatus 5 in the condition where the dicing tape 30 attached to the semiconductor wafer 2 is in contact with the chuck table 51 as shown in FIG. 4. Thereafter, suction means (not shown) is operated to hold the semiconductor wafer 2 through the dicing tape 30 on the chuck table 51 under suction (wafer holding step). Accordingly, the protective film 410 formed on the front side 21a of the functional layer 21 of the semiconductor wafer 2 held on the chuck table 51 is oriented upward. Although the annular frame 3 supporting the dicing tape 30 is not shown in FIG. 4, the annular frame 3 is held by suitable frame holding means provided on the chuck table 51. Thereafter, the chuck table 51 holding the semiconductor wafer 2 is moved to a position directly below the imaging means 53 by operating the feeding means (not shown).

In the condition where the chuck table 51 is positioned directly below the imaging means 53, an alignment operation is performed by the imaging means 53 and the control means (not shown) to detect a subject area of the semiconductor wafer 2 to be laser-processed. More specifically, the imaging means 53 and the control means perform image processing such as pattern matching for making the alignment of the division lines 23 extending in a first direction on the functional layer 21 of the semiconductor wafer 2 and the focusing means 525 of the laser beam applying means 52 for applying the laser beam to the semiconductor wafer 2 along the division lines 23, thus performing the alignment of a laser beam applying position (alignment step). Similarly, the alignment of a laser beam applying position is performed for the other division lines 23 extending in a second direction perpendicular to the first direction on the functional layer 21.

Figure 6A:
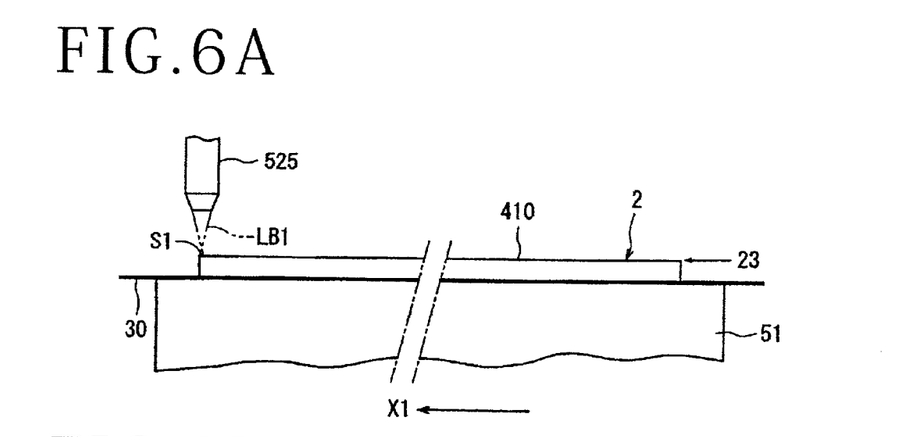
FIGS. 6A to 6D are views for illustrating the functional layer removing step.
Figure 6B:
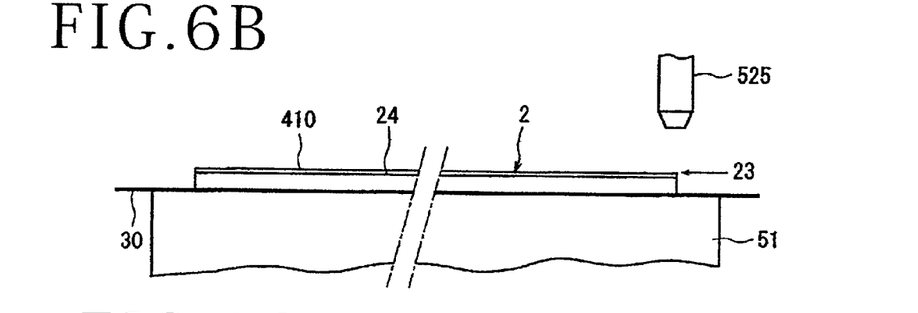
Figure 6C:
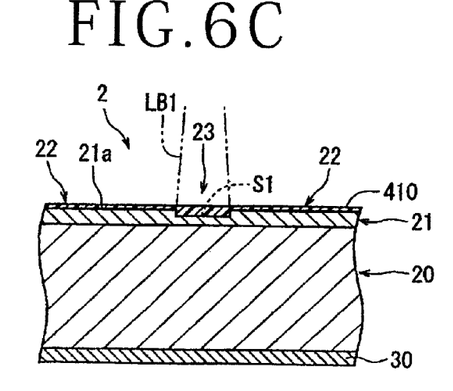

After performing the alignment step mentioned above, the chuck table 51 is moved to a laser beam applying area where the focusing means 525 of the laser beam applying means 52 is located as shown in FIG. 6A, thereby positioning one end (left end as viewed in FIG. 6A) of a predetermined one of the division lines 23 directly below the focusing means 525. Further, as shown in FIGS. 6A and 6C, the square spot S1 of the $CO_2$ laser beam LB1 to be applied from the focusing means 525 is set near the upper surface of the functional layer 21 in the predetermined division line 23. Thereafter, the $CO_2$ laser beam having a wavelength absorptive to the functional layer 21 and transmissive to the substrate 20 is applied from the focusing means 525 to the semiconductor wafer 2, and the chuck table 51 is moved in the direction shown by an arrow X1 in FIG. 6A at a predetermined feed speed. When the other end (right end as viewed in FIG. 6B) of the predetermined division line 23 reaches the position directly below the focusing means 525 as shown in FIG. 6B, the application of the $CO_2$ laser beam is stopped and the movement of the chuck table 51 is also stopped.

For example, the functional layer removing step mentioned above is performed under the following processing conditions.

Figure 6D:
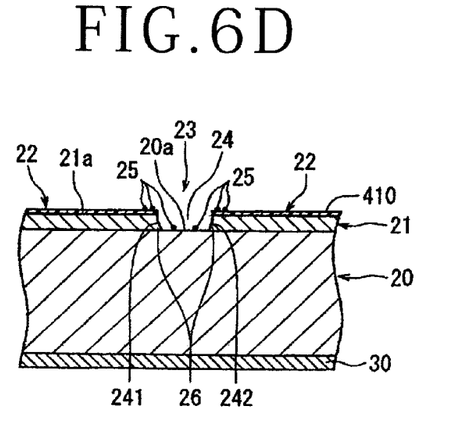

Wavelength of the $CO_2$ laser beam: 9.4 μm or 10.6 μm
Repetition frequency: 10 to 100 kHz
Average power: 50 to 100 W
Square spot S1: A1: 100 μm×B1: 100 μm
Work feed speed: 500 to 5000 mm/s In the functional layer removing step, the wavelength of the $CO_2$ laser beam is set to 9.4 μm or 10.6 μm in the middle infrared region. This wavelength is absorptive to the functional layer 21 of $SiO_2$ or the like and transmissive to the substrate 20 of silicon or the like. Accordingly, the functional layer 21 is ablated by the $CO_2$ laser beam, but ablation hardly occurs on the upper surface of the substrate 20. As a result, the functional layer 21 is removed along the predetermined division line 23 of the semiconductor wafer 2 to form a groove 24 as shown in FIG. 6D, wherein the front side 20a (upper surface) of the substrate 20 as the bottom surface of the groove 24 is maintained in a smooth condition. Further, since the power of the $CO_2$ laser beam in the functional layer removing step is a high power of 50 to 100 W, the functional layer 21 can be removed along the predetermined division line 23 in one stroke of application of the $CO_2$ laser beam, thereby improving the productivity. As described above, the dimension (width) A1 of the square spot S1 in the Y direction is set to 100 μm in this preferred embodiment, so that the width of the groove 24 formed along the predetermined division line 23 becomes 100 μm. This functional layer removing step is similarly performed along all of the division lines 23 of the semiconductor wafer 2.

In performing the functional layer removing step, debris 25 is generated by the application of the $CO_2$ laser beam as shown in FIG. 6D. However, since the protective film 410 is formed on the front side 21a of the functional layer 21 of the semiconductor wafer 2, the debris 25 is blocked by the protective film 410 to thereby prevent the deposition of the debris 25 on the devices 22 formed on the front side 21a of the functional layer 21. However, the debris 25 sticks to the front side 20a (upper surface) of the substrate 20 as the bottom surface of each groove 24 where the functional layer 21 has been removed. Furthermore, residues 26 of the functional layer 21 after ablation are left at the lower portions of the opposite side walls 241 and 242 of each groove 24.

Figure 7:
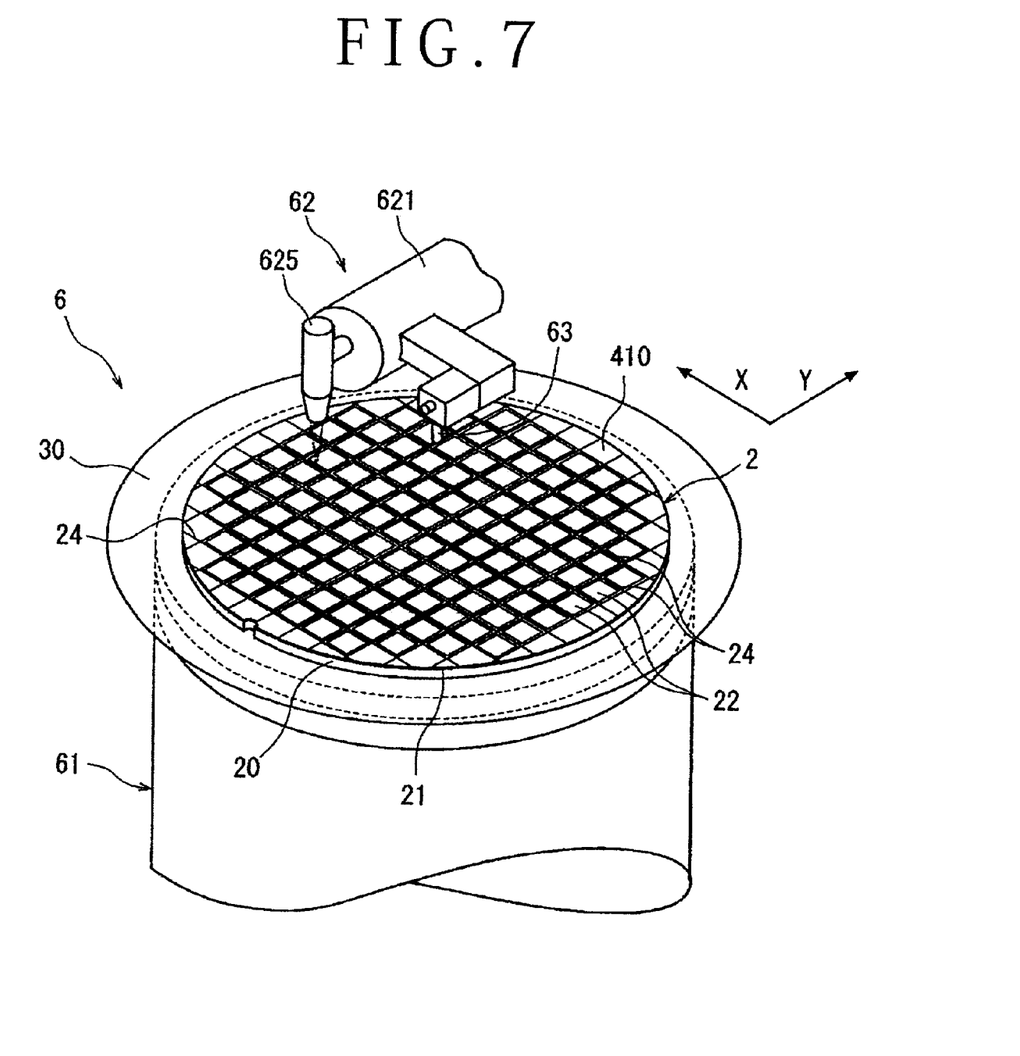
FIG. 7 is a perspective view of an essential part of a laser processing apparatus for performing a groove shaping and debris removing step.

After performing the functional layer removing step mentioned above, a groove shaping and debris removing step is performed in such a manner that a laser beam having a wavelength in the ultraviolet region is applied to the semiconductor wafer 2 along each groove 24 where the functional layer 21 has been removed, thereby removing the debris 25 sticking to the bottom surface of each groove 24 and also removing the residues 26 to shape the side walls of each groove 24. This groove shaping and debris removing step is performed by using a laser processing apparatus 6 shown in FIG. 7. As shown in FIG. 7, the laser processing apparatus 6 includes a chuck table 61 for holding a workpiece, laser beam applying means 62 for applying a laser beam to the workpiece held on the chuck table 61, and imaging means 63 for imaging the workpiece held on the chuck table 61. The chuck table 61 has an upper surface as a holding surface for holding the workpiece thereon under suction. The chuck table 61 is movable both in the feeding direction shown by an arrow X in FIG. 7 by feeding means (not shown) and in the indexing direction shown by an arrow Y in FIG. 7 by indexing means (not shown).

Figure 8:
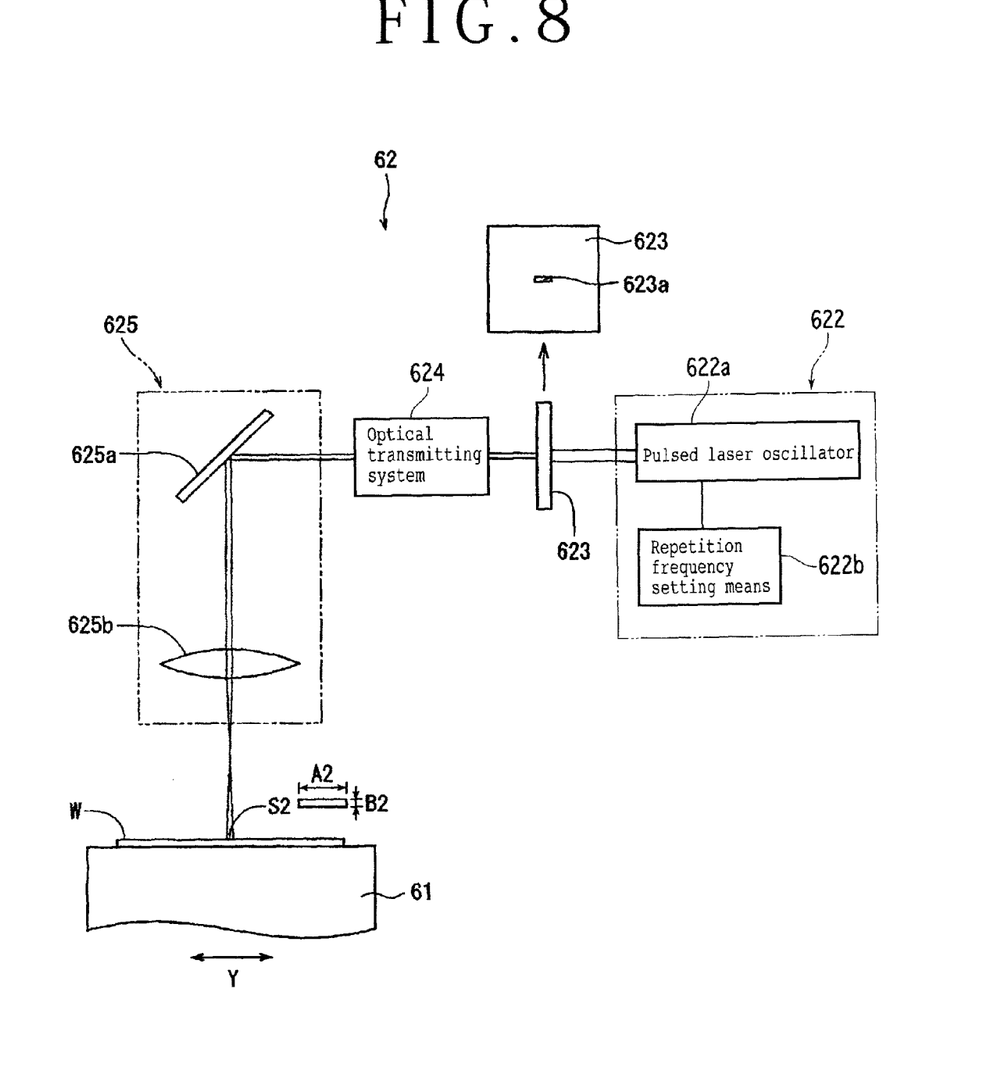
FIG. 8 is a schematic diagram showing the configuration of laser beam applying means included in the laser processing apparatus shown in FIG. 7.

The laser beam applying means 62 includes a cylindrical casing 621 extending in a substantially horizontal direction. As shown in FIG. 8, the casing 621 contains pulsed laser beam oscillating means 622 for oscillating a pulsed laser beam, a mask member 623 for changing the sectional shape of the pulsed laser beam to a rectangular shape, and an optical transmitting system 624 for transmitting the pulsed laser beam whose sectional shape has been changed to a rectangular shape by the mask member 623. The pulsed laser beam oscillating means 622 is composed of a pulsed laser oscillator 622a and repetition frequency setting means 622b connected thereto. In this preferred embodiment, the pulsed laser oscillator 622a oscillates a pulsed laser beam having a wavelength of 266 nm or 355 nm. Further, the mask member 623 has a rectangular opening 623a having a size of 3 mm×0.6 mm, for example. The optical transmitting system 624 functions to guide the pulsed laser beam passed through the mask member 623 to focusing means 625 mounted on the front end of the casing 621.

As shown in FIG. 8, the focusing means 625 includes a direction changing mirror 625a and an image forming lens 625b. The direction changing mirror 625a functions to perpendicularly change the traveling direction of the pulsed laser beam oscillated by the pulsed laser beam oscillating means 622, next changed in sectional shape by the mask member 623, and next guided by the optical transmitting system 624 so that the pulsed laser beam is directed toward the image forming lens 625b. The image forming lens 625b functions to image the pulsed laser beam whose traveling direction has been changed by the direction changing mirror 625a, on the upper surface of a workpiece W held on the chuck table 61. That is, the pulsed laser beam is imaged as a rectangular spot S2 on the upper surface of the workpiece W by the image forming lens 625b as shown in FIG. 8. In this preferred embodiment, the rectangular spot S2 has a size (A2×B2) of 50 μm×10 μm. The dimension (width) A2 of the rectangular spot S2 of the pulsed laser beam in the Y direction is set to a value equal to ½ of the width of each division line 23 (the width of each groove 24, i.e., 100 μm). That is, the dimension (width) A2 of the rectangular spot S2 is set to 50 μm in this preferred embodiment.

The imaging means 63 is mounted on a front end portion of the casing 621 constituting the laser beam applying means 62 as shown in FIG. 7. The imaging means 63 includes illuminating means for illuminating the workpiece, an optical system for capturing an area illuminated by the illuminating means, and an imaging device (CCD) for imaging the area captured by the optical system. An image signal output from the imaging means 63 is transmitted to control means (not shown).

There will now be described with reference to FIG. 7 and FIGS. 9A to 10D the groove shaping and debris removing step of applying a laser beam having a wavelength in the ultraviolet region to the semiconductor wafer 2 along each groove 24 where the functional layer 21 has been removed, by using the laser processing apparatus 6 mentioned above, thereby removing the debris 25 sticking to the bottom surface of each groove 24 and also removing the residues 26 to shape the side walls of each groove 24.

First, the semiconductor wafer 2 processed by the functional layer removing step is placed on the chuck table 61 of the laser processing apparatus 6 in the condition where the dicing tape 30 attached to the semiconductor wafer 2 is in contact with the chuck table 61 as shown in FIG. 7. Thereafter, suction means (not shown) is operated to hold the semiconductor wafer 2 through the dicing tape 30 on the chuck table 61 under suction (wafer holding step). Accordingly, the semiconductor wafer 2 is held on the chuck table 61 in the condition where each groove 24 formed by removing the functional layer 21 along each division line 23 is oriented upward. Although the annular frame 3 supporting the dicing tape 30 is not shown in FIG. 7, the annular frame 3 is held by suitable frame holding means provided on the chuck table 61. Thereafter, the chuck table 61 holding the semiconductor wafer 2 is moved to a position directly below the imaging means 63 by operating the feeding means (not shown).

In the condition where the chuck table 61 is positioned directly below the imaging means 63, an alignment operation is performed by the imaging means 63 and the control means (not shown) to detect a subject area of the semiconductor wafer 2 to be laser-processed. More specifically, the imaging means 63 and the control means perform image processing such as pattern matching for making the alignment of the grooves 24 extending in the first direction on the semiconductor wafer 2 and the focusing means 625 of the laser beam applying means 62 for applying the laser beam to the semiconductor wafer 2 along the grooves 24, thus performing the alignment of a laser beam applying position (alignment step). Similarly, the alignment of a laser beam applying position is performed for the other grooves 24 extending in the second direction perpendicular to the first direction on the semiconductor wafer 2.

Figure 9A:
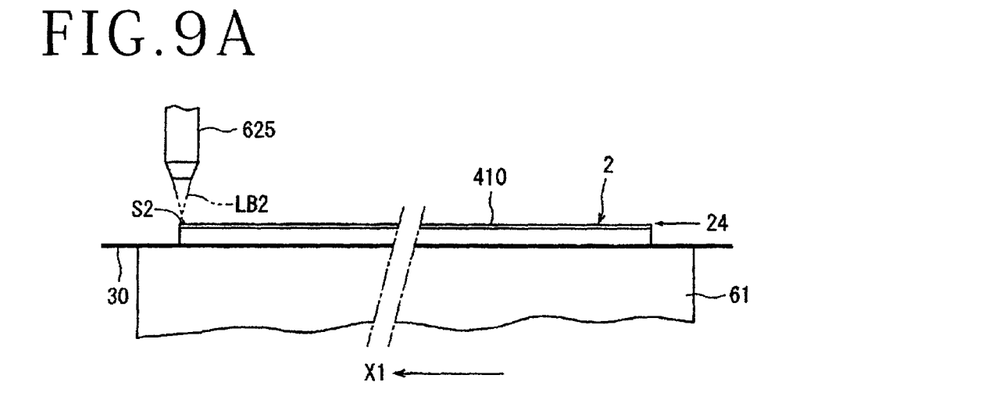
FIGS. 9A to 9D are views for illustrating a first part of the groove shaping and debris removing step.
Figure 9B:
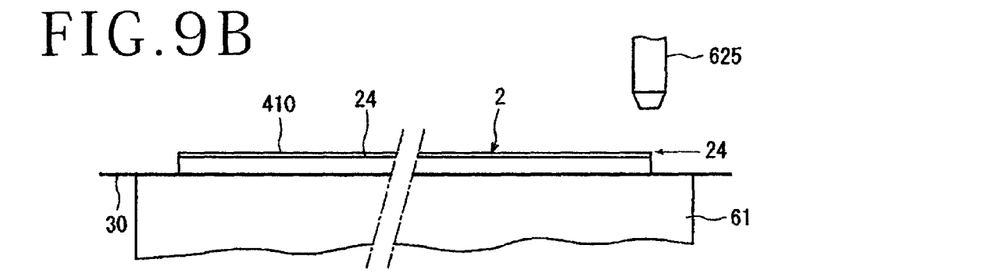
Figure 9C:
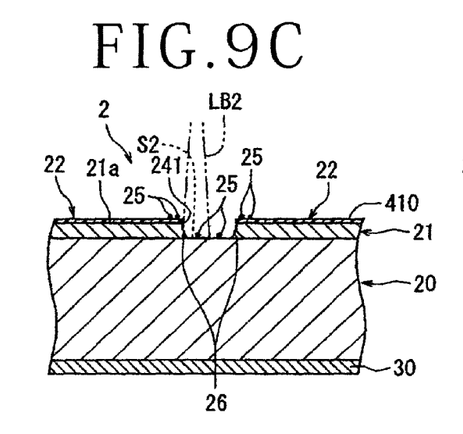

After performing the alignment step mentioned above, the chuck table 61 is moved to a laser beam applying area where the focusing means 625 of the laser beam applying means 62 is located as shown in FIG. 9A, thereby positioning one end (left end as viewed in FIG. 9A) of a predetermined one of the grooves 24 directly below the focusing means 625. Further, as shown in FIGS. 9A and 9C, the rectangular spot S2 of the pulsed laser beam LB2 to be applied from the focusing means 625 is set near the front side 20a (upper surface) of the substrate 20 as the bottom surface of the predetermined groove 24. At this time, the rectangular spot S2 is laterally set between the side wall 241 of the groove 24 and the intermediate position in the direction of the width of the groove 24. That is, since the dimension (width) A2 of the rectangular spot S2 in the Y direction is set to 50 μm in this preferred embodiment as mentioned above, the rectangular spot S2 is set in a laterally half area of the groove 24 having a width of 100 μm. Thereafter, the pulsed laser beam having a wavelength in the ultraviolet region is applied from the focusing means 625 to the semiconductor wafer 2, and the chuck table 61 is moved in the direction shown by an arrow X1 in FIG. 9A at a predetermined feed speed. When the other end (right end as viewed in FIG. 9B) of the predetermined groove 24 reaches the position directly below the focusing means 625 as shown in FIG. 9B, the application of the pulsed laser beam is stopped and the movement of the chuck table 61 is also stopped.

Figure 9D:
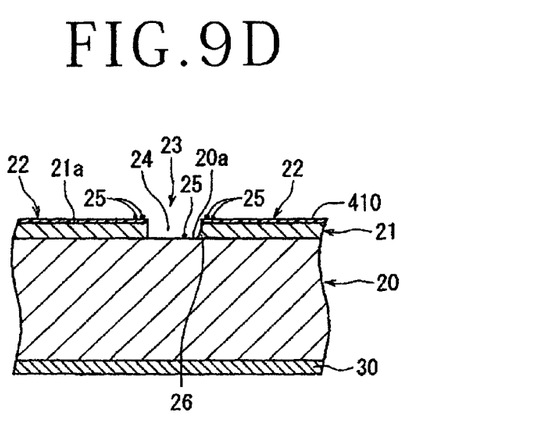

For example, the groove shaping and debris removing step mentioned above is performed under the following processing conditions:
Wavelength of the pulsed laser beam: 266 nm or 355 nm
Repetition frequency: 200 kHz
Average power: 1 to 2 W
Rectangular spot S2: A2: 50 μm×B2: 10 μm
Work feed speed: 200 to 6000 mm/s By performing the groove shaping and debris removing step mentioned above, the left half area of the predetermined groove 24 as viewed in FIG. 9C is processed by the ablation to remove the debris 25 sticking to the front side 20a (upper surface) of the substrate 20 as the bottom surface of the groove 24 and to also remove the residue 26 left at the lower portion of the side wall 241 of the groove 24 as shown in FIG. 9D.

Figure 10A:
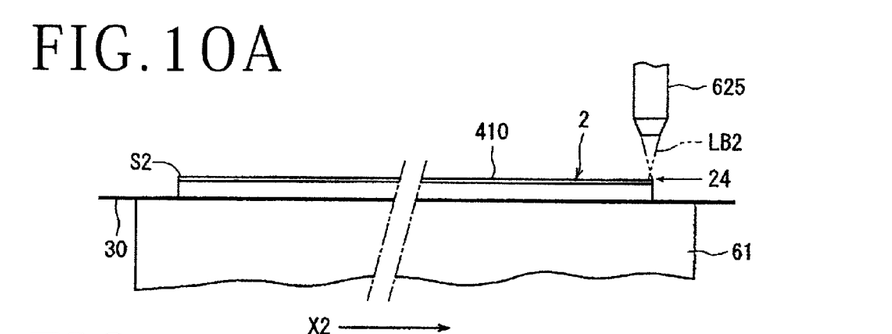
FIGS. 10A to 10D are views for illustrating a second part of the groove shaping and debris removing step subsequent to the first part shown in FIGS. 9A to 9D.
Figure 10B:
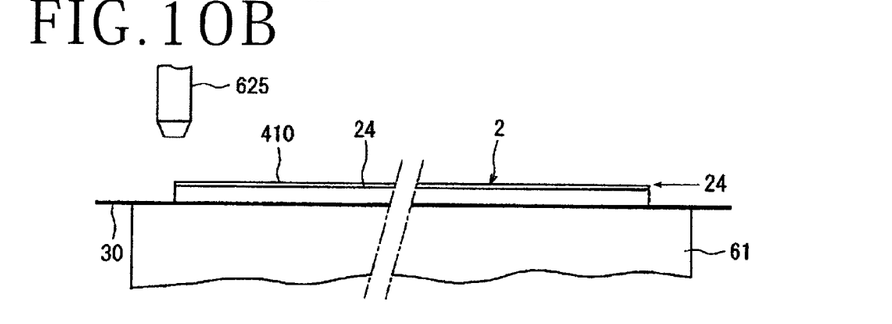
Figure 10C:
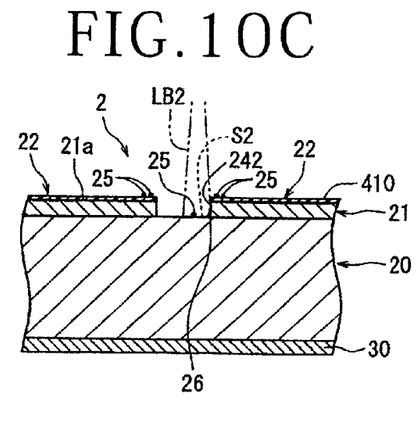

Thereafter, the indexing means (not shown) is operated to move the chuck table 61 in the Y direction (the direction perpendicular to the sheet plane of FIG. 9B) by the amount of 50 μm. This condition is shown in FIG. 10A. At this time, the rectangular spot S2 is laterally set between the other side wall 242 of the groove 24 and the intermediate position in the direction of the width of the groove 24 as shown in FIG. 10C. Accordingly, the rectangular spot S2 is set in the other laterally half area of the groove 24. Thereafter, the pulsed laser beam having a wavelength in the ultraviolet region is applied from the focusing means 625 to the semiconductor wafer 2, and the chuck table 61 is moved in the direction shown by an arrow X2 in FIG. 10A at a predetermined feed speed. When the one end (left end as viewed in FIG. 10B) of the predetermined groove 24 reaches the position directly below the focusing means 625 as shown in FIG. 10B, the application of the pulsed laser beam is stopped and the movement of the chuck table 61 is also stopped.

Figure 10D:
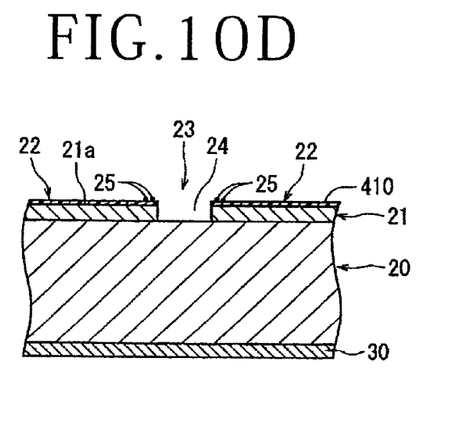

By performing the groove shaping and debris removing step mentioned above, the right half area of the predetermined groove 24 as viewed in FIG. 10C is processed by the ablation to remove the debris 25 sticking to the front side 20a (upper surface) of the substrate 20 as the bottom surface of the groove 24 and to also remove the residue 26 left at the lower portion of the side wall 242 of the groove 24 as shown in FIG. 10D. The groove shaping and debris removing step shown in FIGS. 9A to 10D is similarly performed along all of the grooves 24 formed on the semiconductor wafer 2.

Figure 11:
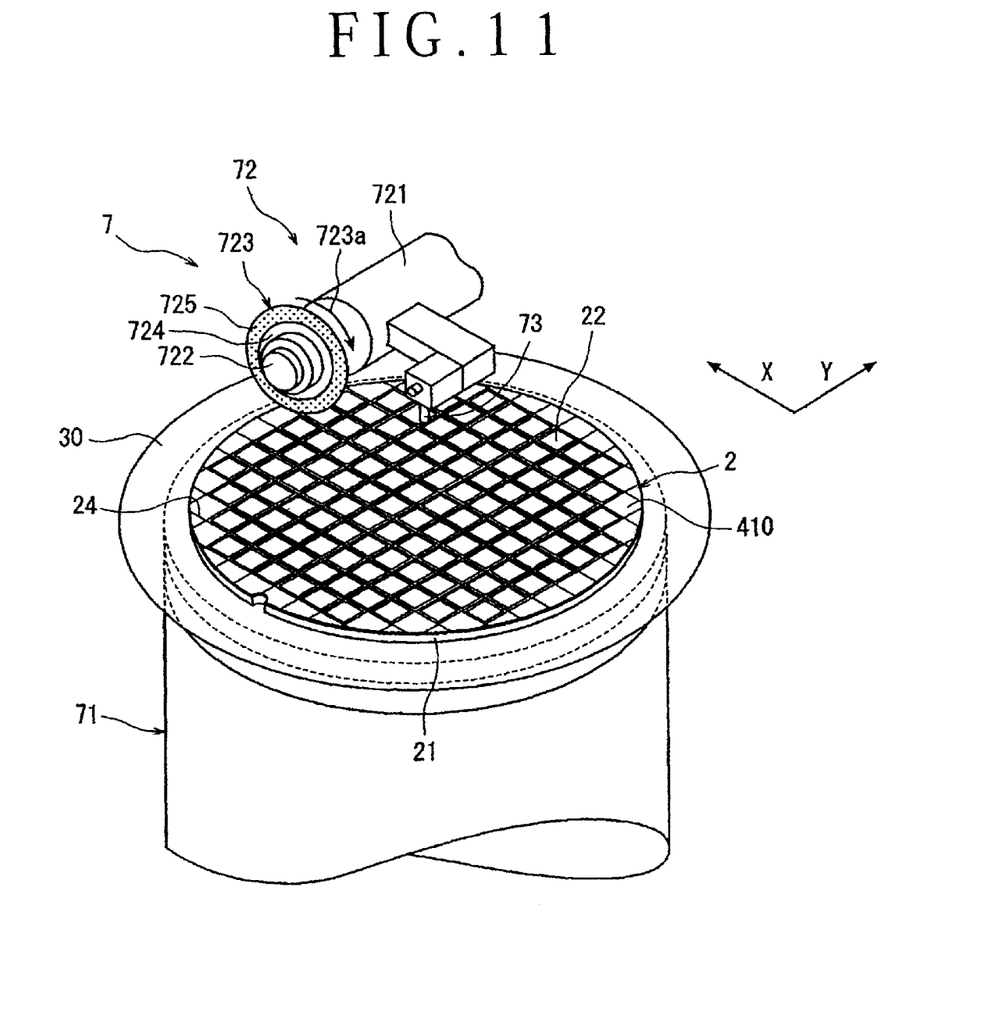
FIG. 11 is a perspective view of an essential part of a cutting apparatus for performing a dividing step.

After performing the groove shaping and debris removing step mentioned above, a dividing step is performed in such a manner that the semiconductor wafer 2 is cut along each groove 24 where the functional layer 21 has been removed, thereby dividing the semiconductor wafer 2 into the individual devices 22. This dividing step is performed by using a cutting apparatus 7 shown in FIG. 11 in this preferred embodiment. As shown in FIG. 11, the cutting apparatus 7 includes a chuck table 71 for holding a workpiece, cutting means 72 for cutting the workpiece held on the chuck table 71, and imaging means 73 for imaging the workpiece held on the chuck table 71. The chuck table 71 has an upper surface as a holding surface for holding the workpiece thereon under suction. The chuck table 71 is movable both in the feeding direction shown by an arrow X in FIG. 11 by feeding means (not shown) and in the indexing direction shown by an arrow Y in FIG. 11 by indexing means (not shown).

The cutting means 72 includes a spindle housing 721 extending in a substantially horizontal direction, a rotating spindle 722 rotatably supported to the spindle housing 721, and a cutting blade 723 mounted on the rotating spindle 722 at a front end portion thereof. The rotating spindle 722 is adapted to be rotated in the direction shown by an arrow 723a by a servo motor (not shown) provided in the spindle housing 721. The cutting blade 723 is composed of a disk-shaped base 724 formed of metal such as aluminum and an annular cutting edge 725 mounted on one side surface of the base 724 along the outer circumference thereof. The annular cutting edge 725 is an electroformed diamond blade produced by bonding diamond abrasive grains having a grain size of 3 to 4 μm with nickel plating to the side surface of the outer circumferential portion of the base 724. For example, the cutting edge 725 has a thickness of 30 μm and an outer diameter of 50 mm.

The imaging means 73 is mounted on a front end portion of the spindle housing 721 and includes illuminating means for illuminating the workpiece, an optical system for capturing an area illuminated by the illuminating means, and an imaging device (CCD) for imaging the area captured by the optical system. An image signal output from the imaging means 73 is transmitted to control means (not shown).

In performing the dividing step by using the cutting apparatus 7 mentioned above, the semiconductor wafer 2 processed by the groove shaping and debris removing step is placed on the chuck table 71 in the condition where the dicing tape 30 is in contact with the chuck table 71 as shown in FIG. 11. Thereafter, suction means (not shown) is operated to hold the semiconductor wafer 2 through the dicing tape 30 on the chuck table 71 under suction (wafer holding step). Accordingly, the semiconductor wafer 2 is held on the chuck table 71 in the condition where the grooves 24 respectively formed along the division lines 23 are oriented upward. Although the annular frame 3 supporting the dicing tape 30 is not shown in FIG. 11, the annular frame 3 is held by suitable frame holding means provided in the chuck table 71. Thereafter, the chuck table 71 holding the semiconductor wafer 2 is moved to a position directly below the imaging means 73 by operating the feeding means (not shown).

In the condition where the chuck table 71 is positioned directly below the imaging means 73, an alignment operation is performed by the imaging means 73 and the control means (not shown) to detect a subject area of the semiconductor wafer 2 to be cut. In this alignment operation, the imaging means 73 images the groove 24 formed along each division line 23 of the semiconductor wafer 2 by the functional layer removing step and the groove shaping and debris removing step. More specifically, the imaging means 73 and the control means perform image processing such as pattern matching for making the alignment of the cutting blade 723 and the groove 24 formed along each division line 23 extending in the first direction on the semiconductor wafer 2, thus performing the alignment of a cut area by the cutting blade 723 (alignment step). Similarly, the alignment of a cut area by the cutting blade 723 is performed for the other groove 24 formed along each division line 23 extending in the second direction perpendicular to the first direction on the semiconductor wafer 2.

After performing the alignment step mentioned above to detect the groove 24 formed along each division line 23 of the semiconductor wafer 2 held on the chuck table 71, the chuck table 71 is moved to a cut start position in the cut area, thereby positioning one end (left end as viewed in FIG. 12A) of a predetermined one of the grooves 24 on the right side of a position directly below the cutting blade 723 by a predetermined amount. Since the groove 24 formed along each division line 23 is directly imaged by the imaging means 73 to detect the cut area in the alignment step mentioned above, the lateral center position of the groove 24 formed along each division line 23 can be reliably set so as to be opposed to the outer circumference of the cutting blade 723.

Figure 12A:
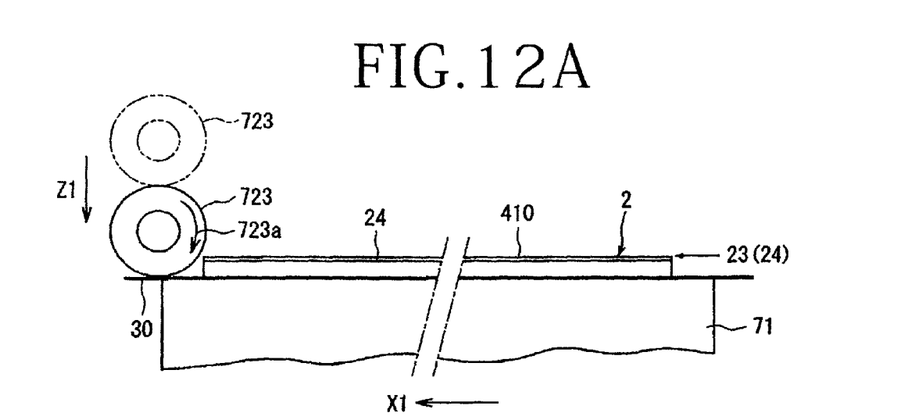
FIGS. 12A to 12D are views for illustrating the dividing step.
Figure 12B:
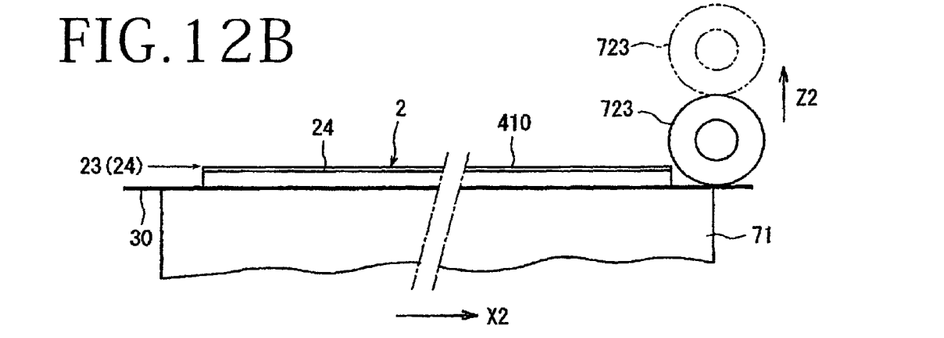
Figure 12C:
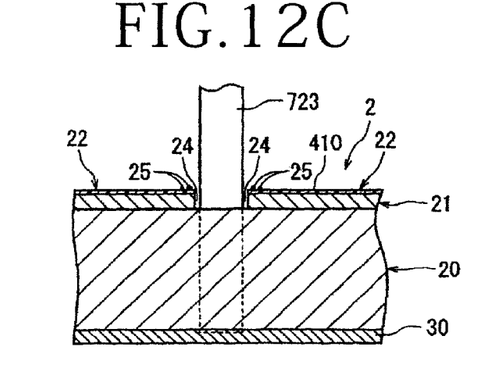

In the condition where the semiconductor wafer 2 held on the chuck table 71 is set at the cut start position in the cut area as described above, the cutting blade 723 is lowered from a standby position shown by a phantom line in FIG. 12A to a working position shown by a solid line in FIG. 12A as shown by an arrow Z1 in FIG. 12A. As shown in FIGS. 12A and 12C, this working position is set so that the lower end of the cutting blade 723 reaches the dicing tape 30 attached to the back side of the semiconductor wafer 2.

Figure 12D:
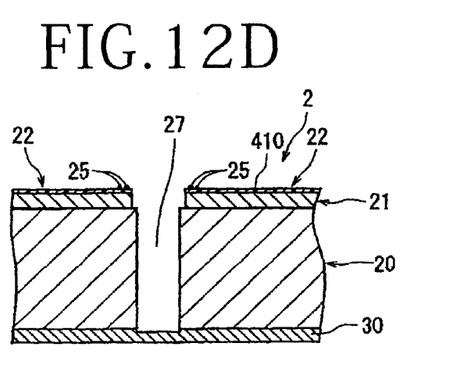

Thereafter, the cutting blade 723 is rotated in the direction shown by an arrow 723a in FIG. 12A at a predetermined rotational speed, and the chuck table 71 is moved in the direction shown by an arrow X1 in FIG. 12A at a predetermined feed speed. When the other end (right end as viewed in FIG. 12B) of the predetermined groove 24 reaches a position on the left side of the position directly below the cutting blade 723 by a predetermined amount as shown in FIG. 12B, the movement of the chuck table 71 is stopped. As a result, a cut groove 27 is formed in the substrate 20 of the semiconductor wafer 2 along the groove 24 formed along the predetermined division line 23 so that the depth of the cut groove 27 reaches the back side of the substrate 20 of the semiconductor wafer 2 as shown in FIG. 12D (dividing step).

Thereafter, the cutting blade 723 is raised from the working position to the standby position as shown by an arrow Z2 in FIG. 12B, and the chuck table 71 is next moved in the direction shown by an arrow X2 in FIG. 12B to the position shown in FIG. 12A. Thereafter, the chuck table 71 is moved in the direction (indexing direction) perpendicular to the sheet plane of FIG. 12A by an amount corresponding to the pitch of the grooves 24, thereby aligning the cutting blade 723 with the next groove 24 to be cut. In the condition where the cutting blade 723 is aligned with the next groove 24 to be cut as mentioned above, the dividing step is performed similarly.

For example, the dividing step mentioned above is performed under the following processing conditions.

Cutting blade: outer diameter 50 mm
thickness 30 μm
Rotational speed of the cutting blade: 20000 rpm
Work feed speed: 50 mm/s The dividing step mentioned above is performed similarly along all of the grooves 24 respectively corresponding to all of the division lines 23 of the semiconductor wafer 2. As a result, the semiconductor wafer 2 is cut along all of the division lines 23 where the grooves 24 are respectively formed and thereby divided into the individual devices 22. In the functional layer removing step, the functional layer 21 formed along each division line 23 is removed to form the groove 24 along each division line 23, so that the substrate 20 is exposed to the groove 24. Accordingly, the debris 25 sticks to the front side 20a (upper surface) of the substrate 20 exposed to each groove 24, and the residues 26 are left at the lower portions of the opposite side walls 241 and 242 of each groove 24. In the groove shaping and debris removing step, the debris 25 and the residues 26 are removed to thereby smoothen the front side 20a (upper surface) of the substrate 20 exposed to each groove 24. Accordingly, in the dividing step, the cutting blade 723 can be relatively moved along each groove 24 with a higher level of linearity, so that the semiconductor wafer 2 can be cut accurately along each division line 23 where the groove 24 is formed.

After performing the dividing step mentioned above, the semiconductor wafer 2 divided into the individual devices 22 (still attached to the dicing tape 30) is transferred to cleaning means (not shown) included in the cutting apparatus 7, and a cleaning step is performed by using this cleaning means to remove contamination generated in cutting the semiconductor wafer 2 and sticking to the semiconductor wafer 2. As described above, the protective film 410 covering the front side 21a of the functional layer 21 of the semiconductor wafer 2 is formed of a water-soluble resin. Accordingly, the protective film 410 can be easily washed away in the cleaning step. Further, the debris 25 generated in the functional layer removing step and sticking to the upper surface of the protective film 410 can also be removed in the cleaning step.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method for dividing a wafer into a plurality of individual devices along a plurality of crossing division lines formed on a front side of said wafer, said wafer including a substrate and a functional layer formed on a front side of said substrate, said individual devices being formed from said functional layer and partitioned by said division lines, said wafer processing method comprising:

a functional layer removing step of applying a $CO_2$ laser beam to said wafer along each division line in the condition where a spot of said $CO_2$ laser beam having a width corresponding to a width of each division line is set on an upper surface of each division line, thereby removing said functional layer along each division line to form a groove along each division line where said functional layer has been removed;

a groove shaping and debris removing step of applying a laser beam having a wavelength in an ultraviolet region to said wafer along each groove after performing said functional layer removing step, thereby removing debris sticking to a bottom surface of each groove and also shaping side walls of each groove; and a dividing step of cutting said wafer along each groove after performing said groove shaping and debris removing step, thereby dividing said wafer into said individual devices.

2. The wafer processing method according to claim 1, further comprising a wafer supporting step of attaching a dicing tape to a back side of said substrate constituting said wafer and supporting a peripheral portion of said dicing tape to an annular frame before performing said functional layer removing step.

3. The wafer processing method according to claim 1, further comprising a protective film forming step of forming a protective film on a front side of said functional layer constituting said wafer before performing said functional layer removing step.

4. The wafer processing method according to claim 1, wherein a wavelength of said $CO_2$ laser beam to be used in said functional layer removing step is set to 9.4 μm or 10.6 μm, and the wavelength of said laser beam to be used in said groove shaping and debris removing step is set to 266 nm or 355 nm.

5. The wafer processing method according to claim 1, wherein said dividing step is performed by using a cutting blade having a peripheral cutting edge.

* * * * *